United States Patent [19]

Toyoshima et al.

[11] Patent Number: 5,241,207
[45] Date of Patent: Aug. 31, 1993

[54] SEMICONDUCTOR DEVICE HAVING AN INTERCONNECTED FILM WITH TAPERED EDGE

[75] Inventors: Yoshiaki Toyoshima, Matsudo; Hirohumi Shinagawa, Kawasaki; Hiroyuki Hayashida, Yokohama, all of Japan

[73] Assignee: Kabushiki Kaisha Toshiba, Kawasaki, Japan

[21] Appl. No.: 878,418

[22] Filed: May 4, 1992

[30] Foreign Application Priority Data

May 10, 1991 [JP] Japan .................................. 3-105864
Mar. 30, 1992 [JP] Japan .................................. 4-073875

[51] Int. Cl.$^5$ ...................... H01L 29/76; H01L 23/48
[52] U.S. Cl. .................................... 257/384; 257/754; 257/757; 257/764
[58] Field of Search .................... 357/68, 71; 437/193, 437/200; 257/384, 754, 757, 764

[56] References Cited

U.S. PATENT DOCUMENTS

| | | | |
|---|---|---|---|
| 4,519,126 | 5/1985 | Hsu | 437/193 |
| 4,648,175 | 3/1987 | Metz, Jr. et al. | 437/193 |
| 4,808,555 | 2/1989 | Mauntel et al. | 357/71 |
| 4,851,257 | 7/1989 | Young et al. | 437/193 |
| 4,914,501 | 4/1990 | Rivoli et al. | 357/71 |
| 5,028,975 | 7/1991 | Nagasawa et al. | 357/71 |
| 5,053,349 | 10/1991 | Matsuoka | 437/193 |
| 5,121,185 | 6/1992 | Wong et al. | 357/71 |

FOREIGN PATENT DOCUMENTS 1-157523  6/1989  Japan .................................. 437/193
WO89/11732 11/1989  PCT Int'l Appl. .................. 437/200

Primary Examiner—Rolf Hille
Assistant Examiner—Steven Loke
Attorney, Agent, or Firm—Finnegan, Henderson, Farabow, Garrett & Dunner

[57] ABSTRACT

A semiconductor device comprises an element separating insulation film formed on a main surface of a silicon substrate, an insulation film formed to project from the edge portion of the element separating insulation film onto a part of a silicon region of the substrate and having a thickness smaller than the thickness of the element separating insulation film, a first metal silicide film formed to cover the element separating insulation film and the thin insulation film in the vicinity of the edge portion of the element separating insulation film, a second metal silicide film formed on the silicon region in the vicinity of the thin insulation film, and a third metal silicide film formed in the vicinity of the tip portion of the thin insulation film for connecting the first and and second metal silicide films.

2 Claims, 4 Drawing Sheets

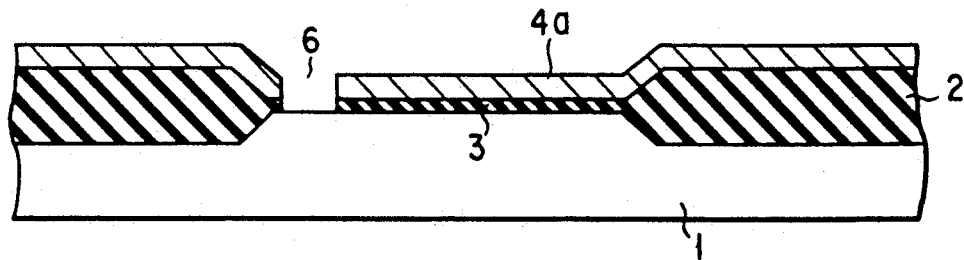
FIG. IA    (PRIOR ART)
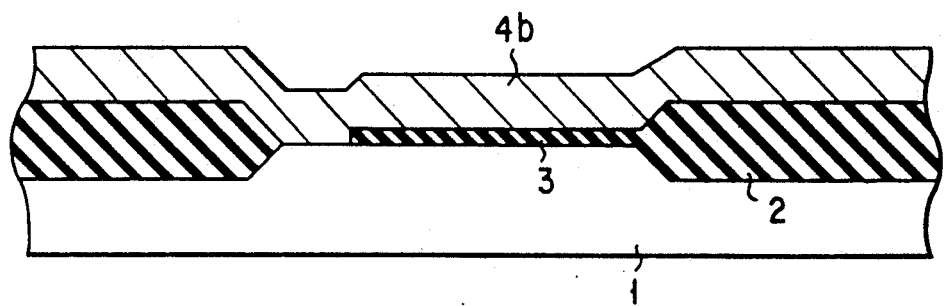
FIG. IB    (PRIOR ART)
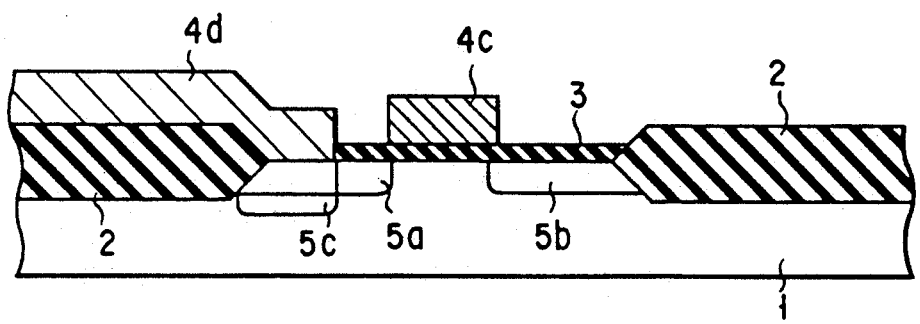
FIG. IC    (PRIOR ART)

5,241,207

SEMICONDUCTOR DEVICE HAVING AN INTERCONNECTED FILM WITH TAPERED EDGE

BACKGROUND OF THE INVENTION

1. Field of the Invention

The present invention relates to a semiconductor device and a method of manufacturing the same, particularly, to a method of forming a wiring layer and an electrode of a MOS semiconductor device using a selfaligned silicidation technique.

2. Description of the Related Art

FIGS. 1A to 1C collectively show a method of directly achieving an ohmic contact between source or drain diffusion layers and a polysilicon film used as a wiring layer. These drawings show a p-type silicon substrate 1, an insulation film 2 for separating elements, i.e., for separating adjacent MOS transistors from each other, a gate insulation film 3, polysilicon films 4a, 4b, a gate electrode 4c formed of a polysilicon film, a wiring 4d formed of a polysilicon, n-type source/drain regions 5a/5b, and a diffusion layer 5c for an n-type contact.

To be more specific, the polysilicon film 4a is deposited on the insulation film 2 for element separation, which is formed on the surface of the substrate 1, and on the gate insulation film 3 in an active element region surrounded by the insulation film 2, as shown in FIG. 1A. Then, the polysilicon film 4a and the gate insulation film 3 are selectively removed by the lithography technique so as to form an opening 6. Further, the polysilicon film 4b is deposited on the entire surface, with the result that the polysilicon film 4b is in direct contact with the substrate 1 via the opening 6, as shown in FIG. 1B.

In the next step, an impurity is introduced into the polysilicon film 4b so as to lower the resistance of the polysilicon film 4b and to achieve an ohmic contact between the substrate 1 and the polysilicon film 4b. Then, the polysilicon film 4b is patterned by the lithography technique so as to form the polysilicon gate electrode 4c and a direct contact region between the polysilicon wiring 4d and the source region 5a. Thereafter, a MOS transistor provided with the gate electrode 4c is formed by the ordinary method.

In the conventional technique described above, however, it is impossible to remove completely a natural oxide film within the opening 6 for forming a contact region. It follows that the natural oxide film remains at the interface between the polysilicon film 4b and the substrate 1, leading to a high contact resistance.

It should also be noted that the impurity is introduced into the polysilicon film 4b by means of an ion implantation technique or a gaseous phase diffusion technique in order to achieve an ohmic contact between the polysilicon film 4b and the substrate 1. For achieving the ohmic contact, i.e., for sufficiently reducing the contact resistance, an impurity should be introduced with a high concentration. As a result, the junction depth of the diffusion layer 5c in the contact region formed in the substrate 1 is made deeper than that of the diffusion layer 5a. It follows that the withstand voltage is lowered between the diffusion layers of the adjacent active regions separated from each other by the element separating insulation film 2, i.e., between the diffusion layer 5c shown in FIG. 1C and the diffusion layer corresponding to the diffusion layer 5a of the adjacent active region (not shown). What should be noted is that, in the prior art shown in FIG. 1C, the improvement in the contact resistance bring about a low withstand voltage, and vice versa.

SUMMARY OF THE INVENTION

The present invention, which has been achieved in view of the situation described above, is intended to provide a semiconductor device which permits lowering the contact resistance between the wiring layer and the diffusion layer while maintaining a shallow junction depth of the diffusion layer positioned right under the contact portion of the wiring layer, and a method of manufacturing the same.

According to the present invention, there is provided a semiconductor device, comprising an element separating insulation film formed on the surface of a silicon substrate, an insulation film thinner than said element separating insulation film and formed to project from the edge portion of said element separating insulation film onto a part of a silicon region of the substrate, a first metal silicide film formed to cover the element separating insulation film and said thin insulation film in the vicinity of the edge portion of the element separating insulation film, a second metal silicide film formed on the silicon region in the vicinity of the thin insulation film, and a third metal silicide film formed in the vicinity of the tip portion of the thin insulation film for connecting said first and second metal silicide films.

In the present invention, a silicon film is formed between the first metal silicide film and the insulation film including the element separating insulation film and the thin insulation film in the vicinity of the element separating insulation film. What should be noted is that the silicon film noted above is upwardly tapered such that the thickness of the silicon film is decreased toward the first metal silicide film.

The present invention also provides a method of manufacturing a semiconductor device, comprising the steps of:

forming an element separating insulation film on a main surface of a silicon substrate;

forming an insulation film thinner than said element separating insulation film and formed to project from the edge portion of the element separating insulation film onto a part of the silicon region of the substrate;

forming a silicon film or a silicon-containing alloy film in a manner to cover the element separating insulation film and the thin insulation film;

patterning said silicon film or said alloy film on said thin insulation film, followed by further patterning partly the thin insulation film with the patterned silicon film or alloy film used as a mask so as to selectively expose the silicon region on the surface of the silicon substrate;

depositing a metal film on the silicon film or the alloy film and on a region including said exposed silicon region in the vicinity of the thin insulation film; and applying a heat treatment so as to carry out an alloying reaction between the metal film and silicon in and around the contact regions between the two so as to form a metal silicide film and, thus, to form a wiring film in which the metal silicide film formed to cover the element separating insulation film and the thin insulation film is connected to the metal silicide film covering said silicon region.

It is important to note that, in the method of the present invention, the first and second metal silicide films are connected to each other with the third metal silicide film interposed therebetween. As a result, the contact resistance of the wiring layer is hardly affected by the natural oxide film formed at the interface between the second metal silicide film and the silicon region in direct contact therewith, making it possible to achieve a low contact resistance. It should also be noted that, in the prior art, it is necessary to diffuse an impurity deep into the source or drain diffusion region through the polysilicon film formed on the source or drain diffusion layer in order to achieve an ohmic contact. In the present invention, such an impurity diffusion is unnecessary because the wiring layer is formed of a metal silicide. It follows it is possible to prevent deterioration of the withstand voltage between diffusion layers in the active element regions separated from each other by the element separating insulation film. Further, the thin insulation film extending from the edge portion of the element separating insulation film onto a part of the silicon region acts as an etching stopper in the patterning step of the wiring silicon film. Naturally, the silicon region is prevented from being over-etched. Incidentally, in the step of the heat treatment for forming the first and second metal silicide films, silicon atoms are extracted from the silicon layer, with the result that extracted silicon atoms are involved in the alloying reaction to form the third metal silicide film.

To reiterate, the silicon layer formed to cover the element separating insulation film and the thin insulation film in the vicinity of the element separating insulation film is converted later into a metal silicide film by the subsequent heat treatment. What should be noted is that the edge portion of the silicon film noted above is upwardly tapered in the present invention. As a result, the wiring of the metal silicide film formed later is made smooth, leading to an improved reliability in the formation of the metal silicide wiring layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1C are cross sectional views collectively showing a conventional method of manufacturing a semiconductor device;

DETAILED DESCRIPTION OF THE PREFERRED EMBODIMENT

Figure 2A:
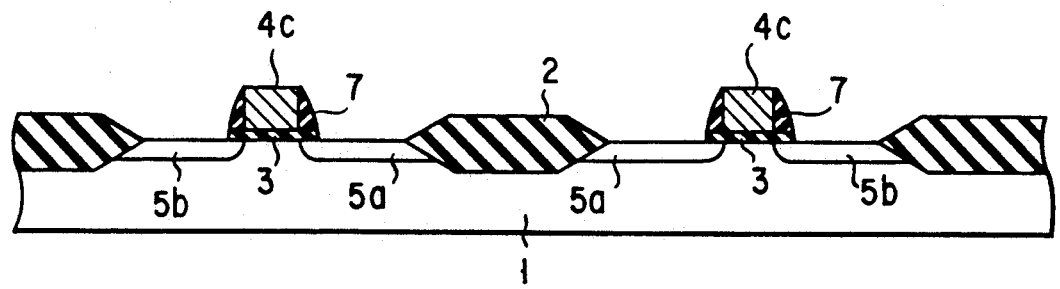
FIGS. 2A and 2D are cross sectional views collectively showing a method of manufacturing a semiconductor device according to one embodiment of the present invention.
Figure 2B:
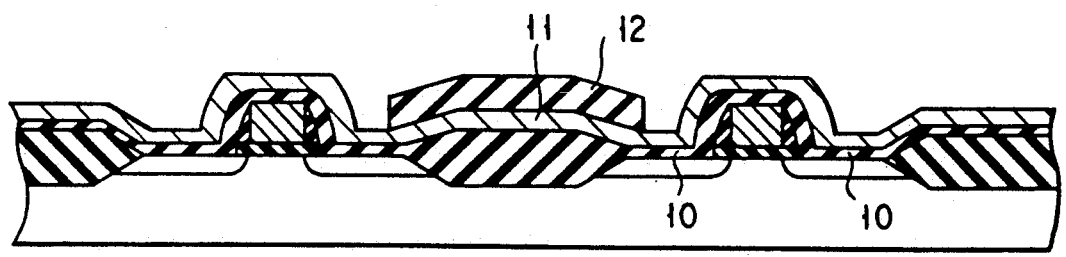

FIGS. 2A to 2D collectively show a method of manufacturing a semiconductor device according to one embodiment of the present invention. Reference numerals common with FIGS. 1 and 2 denote the same members of the device. As shown in FIG. 2A, an element separating insulation film 2, a gate insulation film 3 and a gate electrode 4c are formed on a p-type semiconductor substrate 1, followed by forming source and drain diffusion layers 5a, 5b by the conventional technique. After formation of the insulation films, an insulative side wall 7 is formed on the side surface of the gate electrode by means of an anisotropic etching technique.

Figure 2C:
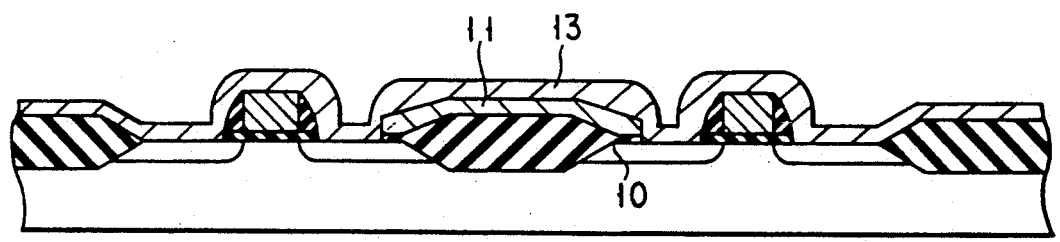

In the next step, an oxide film 10 about 15 nm thick is formed to cover the gate electrode 4c, and the diffusion layers 5a, 5b, followed by depositing a polysilicon film 11 about 200 nm thick on the oxide film 10. Then, a resist pattern 12 is formed on that portion of the polysilicon film 11 which is positioned on the element separating insulation film 2 and the gate insulation film 10 in the vicinity of the element separating insulating film 2 by means of the photolithography, followed by removing the polysilicon film 11 except for the region right under the resist pattern 12 by the dry etching method which permits a high selectivity for an oxide film, as shown in FIG. 2C. Further, the resist pattern 12 is removed as shown in FIG. 2C. Also, the exposed oxide film 10 is removed by the wet etching, followed by forming a high melting point metal film 13 on the entire surface. In this embodiment, a titanium film having a thickness of 40 nm is used as the metal film 13. Then, a heat treatment is applied so as to bring about an alloying reaction between titanium and silicon. In this embodiment, the heat treatment is applied under a high temperature, e.g., 750° C., for a short time, e.g., 30 seconds, within a nitrogen atmosphere. As a result, a metal silicide film 14 is formed in the portions where the metal film 13 is in contact with silicon films, i.e., on the silicon film of the substrate 1, the polysilicon film 11 and the polysilicon gate electrode 4c. During the heat treatment, a metal silicide layer is also formed in the tip portion of the thin oxide film 10 shown in FIG. 2D. To be more specific, silicon atoms are migrated upward from the silicon layer 5a into the tip portion of the oxide film 10 during the heat treatment. Likewise, silicon atoms are migrated wideside from the silicon film 11 into the tip portion of the oxide film 10, with the result that an alloying reaction between Ti and Si takes place at the tip portion of the oxide film 10 so as to form a metal silicide film as pointed out above. What should be noted is that, since the oxide film 10 is very thin, the metal silicide film formed in the tip portion of the oxide film 10 permits the metal silicide film 14 formed on the oxide films 2 and 10 to be connected to the metal silicide film 14 formed on the diffusion layer 5a. After the heat treatment, the unreacted metal film 13 positioned on, for example, the side wall 7 is removed by a treatment with, for example, a solution containing both ammonium hydroxide and hydrogen peroxide, followed by applying a heat treatment again. The heat treatment is intended to form $TiSi_2$ having $C_{54}$ crystal structure so as to lower the resistivity of the metal silicide film 14. In the embodiment shown in the drawing, an RTA (rapid thermal annealing) method is employed as the heat treatment at 900° C. for 20 seconds. As a result, the structure as shown in FIG. 2D is formed.

Figure 2D:
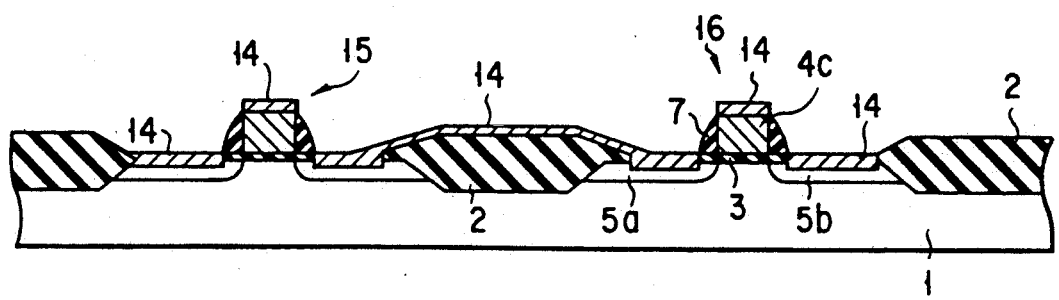

In the semiconductor device constructed as shown in FIG. 2D, prominent effects can be obtained in connecting the MOS transistors 15 and 16, as summarized below:

1. Since the wiring layer 11 in the contact region with the diffusion layer 5a is formed of the metal silicide film, the natural oxide film at the interface between the polysilicon film and the silicon substrate, which gives a detrimental effect in the prior art, need not be worried about in the present invention. It follows that it is possible to achieve a low contact resistance.

2. In the prior art, an impurity is introduced for forming an ohmic contact, as denoted by the reference numeral 5c in FIG. 1C. However, the impurity introduction for achieving an ohmic contact can be omitted in the present invention. It follows that the junction depth of the source-drain diffusion layers 5a, 5b can be maintained shallow so as to prevent the withstand voltage between the diffusion layers of the active element regions separated from each other by the element separating insulating film 2 from being lowered.

3. The oxide film 10 formed beneath the polysilicon film 11 serves to prevent the diffusion layers 5a from being over-etched in patterning the polysilicon film 11. Specifically, both the polysilicon film 11 and the diffusion layer 5a consist essentially of silicon and, thus, are etched at the same rate (no etching selectivity). It follows that the diffusion layer is over-etched to form a hole, if the oxide film 10 is not present. In this case, a serious problem is brought about in the subsequent heat treatment for the alloying reaction to form a metal silicide layer on the surface of the diffusion layer 5a. Specifically, the formed silicide layer extends through the diffusion layer 5a to reach the substrate 1, leading to deterioration of the breakdown voltage between the semiconductor layer 1 and the diffusion layer 5a. In the present invention, however, the oxide film 10 shown in FIG. 2 serves to prevent the polysilicon film 11 from being over-etched in the patterning step of the film 11. It follows that the deterioration of the breakdown voltage noted above need not be worried about in the present invention.

4. The natural oxide film formed between the metal film 13 and the silicon layer is considered to be somewhat reduced during the alloying reaction to form the metal silicide film so as to lower the wiring resistance. It follows that it is possible to lower the contact resistance and to make the wiring layer thinner in an integrated circuit.

FIGS. 3A to 3E shown another embodiment of the present invention. This embodiment permits overcoming a difficulty shown in FIG. 4, which is inherent in the embodiment shown in FIG. 2. Specifically, the film 11 is subjected to a dry etching treatment to form a local wiring pattern covering the element separating insulation film 2 and end portions of source-drain regions 5a, 5b in the embodiment of FIG. 2, as described previously. What should be noted is that the edge portion of the wiring pattern is downwardly tapered to form a tapered portion 11a, as shown in FIG. 4. Thus, in the subsequent step of depositing the high-melting point metal film 13, the thickness of the metal film 13 becomes insufficient in, particularly, a stepped portion 18 at the lower end of the tapered portion 11a, with the result that the wiring tends to be made non-conductive. The embodiment of FIG. 3 is intended to overcome this difficulty.

Figure 3A:
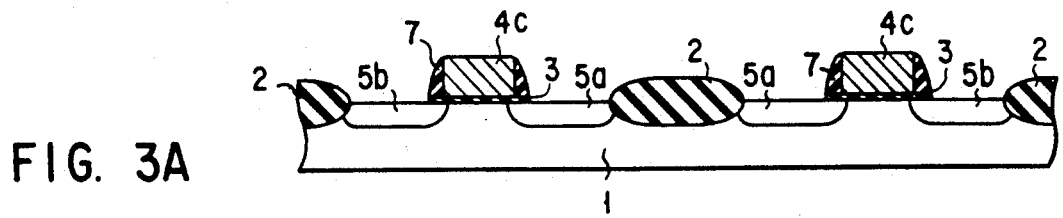
FIGS. 3A to 3E are cross sectional views collectively showing a method of manufacturing a semiconductor device according to another embodiment of the present invention.
Figure 3B:
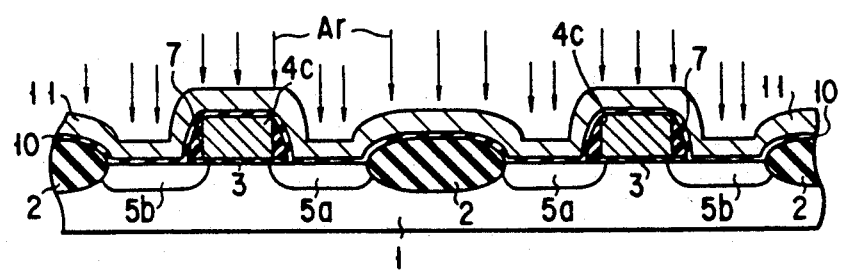
Figure 3C:
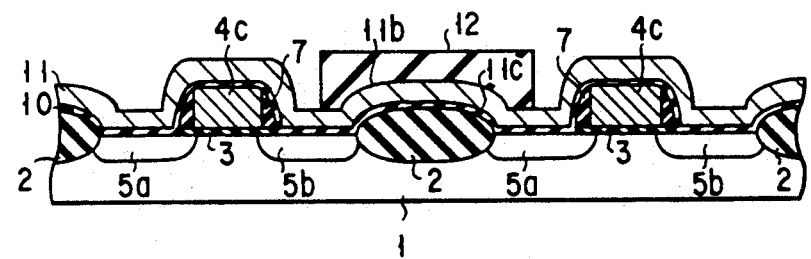

In the embodiment of FIG. 3, the structure shown in FIG. 3A is prepared by the steps equal to those employed for preparing the structure shown in FIG. 2A. Of course, the reference numerals common with FIGS. 2 and 3 denote the same members. In the next step, an oxide film 10 about 10 nm thick is formed on the entire surface including the gate electrode 4c and the source-drain regions 5a, 5b, followed by depositing a polysilicon film 11 on the oxide film 10 in a thickness of 200 nm, as shown in FIG. 3B. Then, argon ions are implanted into the entire surface region of the polysilicon film 11 so as to convert the surface region into a non-crystalline layer. In other words, the argon ion implantation causes the polysilicon film 11 to be converted into a laminate structure consisting of an upper non-crystalline layer 11b and a lower polysilicon layer 11c.

Figure 5:
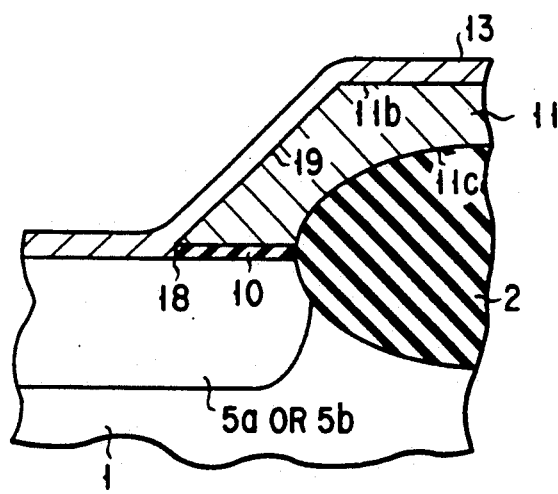
FIG. 5 is a cross sectional view showing in a magnified fashion a portion included in the embodiment of the present invention shown in FIG. 3.

After the ion implantation, a resist pattern 12 is formed on that portion of the non-crystalline layer 11b which is positioned above the element separating insulation film 2 and the oxide film 10 in the edge portions of the polysilicon layer 11 is selectively removed by means of a dry etching method performing a high etching selectivity for the oxide film by using the resist pattern 12 as a mask. It should be noted that the etching rate of the non-crystalline silicon layer 11b is higher than that of the polysilicon layer 11c positioned below the non-crystalline layer 11b. It follows that an isotropic dry etching is applied under the same conditions to the laminate structure 11 consisting of the layers 11b and 11c, the edge portion of the laminate structure 11, i.e., local wiring layer, is upwardly tapered. In other words, the thickness of the edge portion of the laminate structure 11, (the distance between the thin oxide layer which is formed on the semiconductor and the tapered surface of layer 11), gradually decreases toward the upper portion to form an upwardly tapered portion 19, as shown in FIG. 5. After the dry etching step, the resist pattern 12 is removed.

Figure 3D:
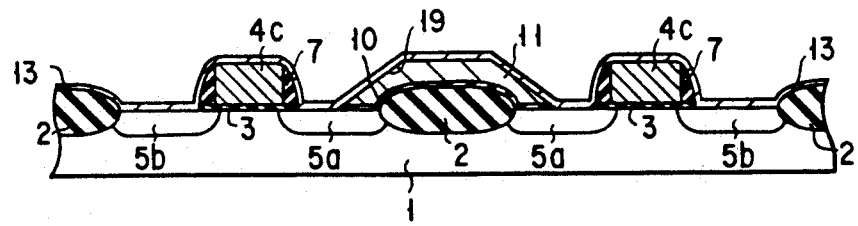
Figure 4:
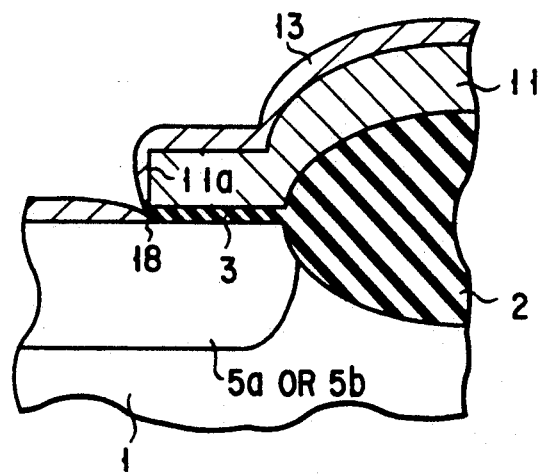
FIG. 4 is a cross sectional view showing in a magnified fashion a defective portion accompanying the embodiment of the present invention shown in FIG. 2.

Further, the oxide film 10 is selectively removed so to expose partly the surfaces of the source-drain diffusion layers 5a, 5b and the surface of the gate electrode 4c, followed by depositing a high-melting point metal film 13 on the entire surface, as shown in FIG. 3D. In this embodiment, the metal film 13 consists of a titanium film having a thickness of 40 nm. As described previously, the edge portion of the local wiring pattern 11 forms an upwardly tapered portion 19. In addition, the oxide film 10 is very thin. As a result, the titanium film 13 is formed uniformly. Particularly, the titanium film 13 is sufficiently thick in the stepped portion 18, as shown in FIG. 5.

Figure 3E:
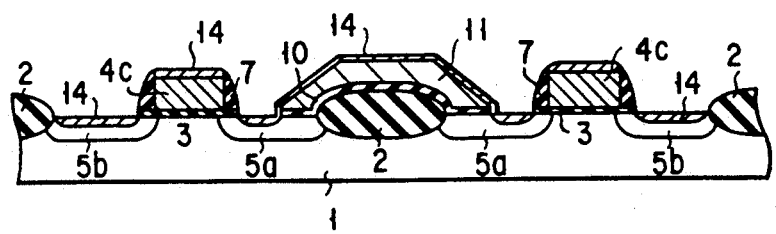

In the next step, a heat treatment is applied so as to carry out an alloying reaction, as shown in FIG. 3E. The heat treatment is carried out under a nitrogen atmosphere at a high temperature, i.e., 750° C., for a short time, i.e., 30 seconds. As a result, a metal silicide (titanium silicide) film 14 is formed in contact regions between the metal film 13 and the silicon layers 4c, 5a, 5b and 11. After the heat treatment, the unreacted portion of the metal film 13 is removed by using a solution containing both sulfuric acid and hydrogen peroxide or a solution containing both ammonium hydroxide and hydrogen peroxide. Then, a heat treatment is applied again so as to form $TiSi_2$ having $C_{54}$ crystal structure in the metal silicide film 14 so as to lower the resistivity of the metal silicide film 14. The heat treatment in this step is carried out by RPA at 900° C. for 20 seconds under a nitrogen atmosphere so as to obtain a structure as shown in FIG. 3E.

Figure 6:
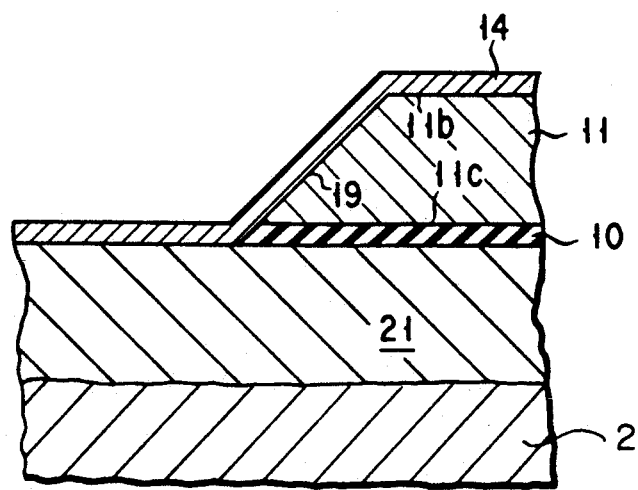
FIG. 6 is a cross sectional view showing still another embodiment of the present invention.

FIG. 6 shows a still another embodiment of the present invention. In this embodiment, another polysilicon wiring 21 is formed on, for example, the element separating insulation film 2. Further, the laminated structure 11 with an upwardly tapered edge portion 19 is formed in direct contact with the insulation film 10. After formation of the laminated structure 11, a metal silicide film 14 is formed to cover the silicon films 11 and 21. In this embodiment, the tapered portion 19 of the laminated structure 11 permits the metal silicide layer 14 to be formed in a uniform thickness, with the result that the wiring connection between the metal silicide film 14 and the polysilicon wiring 21 can be achieved satisfactorily.

The present invention is not restricted to the embodiments described above. In other words, various modifications are available within the technical scope of the present invention. For example, a titanium film is used as the high-melting point metal film in any of the embodiments described above. However, a film of Ti, W, Co, Pt, Mo or an alloy thereof can be used in place of the titanium film. Also, a laminate structure consisting of a polysilicon layer and a non-crystalline silicon layer is used as a local wiring layer in the embodiments described above. However, a non-crystalline silicon film, a silicon alloy film or a monocrystalline silicon film may also be used in place of the laminated structure noted above. Further, the technical idea of the present invention is applied to a single channel type MOS structure in the embodiments described above. However, the technical idea of the present invention can also be applied to a CMOS structure, with satisfactory effects.

What should also be noted is that, in the embodiments described above, an ion implantation is applied to the polysilicon film 11 so as to convert the film 11 into a laminated structure consisting of a non-crystalline silicon layer and a polysilicon layer. However, the ion implantation step can be omitted, if the laminate structure is prepared by forming a non-crystalline silicon layer on a polysilicon layer formed in advance. Also, in the case of employing an ion implantation technique, the ions used are not restricted to argon ions. In other words, any ion can be used as far as the ion implanted region of the polysilicon film can be converted into a non-crystalline region.

As described above in detail, the present invention permits lowering the contact resistance between a local wiring and a diffusion layer while maintaining shallow the junction depth of the diffusion layer. Also, an upwardly tapered portion is formed in the edge portion of the silicon laminated structure acting as a connecting portion of the local wiring so as to improve the step coverage in the subsequent step of depositing a metal having a high melting point, making it possible to improve the electrical and physical properties of the wiring.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device, comprising:
   an element separating insulation film formed on a surface of a silicon substrate;
   a thin insulation film formed to project from an edge portion of said element separating insulation film onto a part of a silicon region of said substrate and having a thickness smaller than the thickness of the element separating insulation film;
   a first metal silicide film formed to cover the element separating insulation film and said thin insulation film in the vicinity of the edge portion of the element separating insulation film;
   a second metal silicide film formed on the silicon region in the vicinity of the thin insulation film;
   a third metal silicide film formed in the vicinity of a tip portion of the thin insulation film for connecting said first and second metal silicide films; and
   a silicon film formed between the element separating insulation film including the thin insulation film in the vicinity thereof and the first metal silicide film, said silicon film being tapered such the thickness of the silicon film gradually decreases toward the first metal silicide film in the vicinity of an edge portion of said thin insulation film formed to project from the edge portion of said element separating insulation film.

2. The semiconductor device according to claim 1, wherein said silicon film is of a laminate structure consisting of a polysilicon layer positioned on the side of the thin insulation film and a non-crystalline silicon layer positioned on the side of the metal silicide film.

* * * * *